(12) United States Patent
Kagawa

(10) Patent No.: US 10,609,810 B2
(45) Date of Patent: *Mar. 31, 2020

(54) METHOD FOR PRODUCING HEAT-DISSIPATING SHEET HAVING HIGH THERMAL CONDUCTIVITY

(71) Applicant: Seiji Kagawa, Koshigaya (JP)

(72) Inventor: Seiji Kagawa, Koshigaya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/175,098

(22) Filed: Oct. 30, 2018

(65) Prior Publication Data

US 2019/0069389 A1    Feb. 28, 2019

Related U.S. Application Data

(62) Division of application No. 14/539,595, filed on Nov. 12, 2014, now abandoned.

(30) Foreign Application Priority Data

Mar. 5, 2014    (JP) .................................. 2014-43196

(51) Int. Cl.
*B05D 3/02*    (2006.01)
*B05D 7/00*    (2006.01)
(Continued)

(52) U.S. Cl.
CPC ............. *H05K 1/0203* (2013.01); *B05D 1/02* (2013.01); *B05D 1/36* (2013.01); *B05D 3/007* (2013.01);
(Continued)

(58) Field of Classification Search
CPC ..... C09K 5/00; C09K 5/08; C09K 5/14; C08J 5/18; C04B 35/536; C04B 35/522;
(Continued)

(56) References Cited

U.S. PATENT DOCUMENTS 5,863,467 A    1/1999  Mariner et al.
6,482,520 B1 *  11/2002  Tzeng ................. H01L 21/4871
                                                      428/408
(Continued)

FOREIGN PATENT DOCUMENTS

DE  10 2011 079 581 A1    1/2013
EP       2 426 096 A1    3/2012
(Continued)

OTHER PUBLICATIONS

Yu et al., "Graphite Nanoplatelet-Epoxy Composite Thermal Interface Materials," J. Phys. Chem. C, vol. 111, No. 21, 2007, 7565-7569 (Year: 2007).*

(Continued)

*Primary Examiner* — William P Fletcher, III
(74) *Attorney, Agent, or Firm* — Birch, Stewart, Kolasch & Birch, LLP

(57) ABSTRACT

A heat-dissipating sheet having a density of 1.9 g/cm$^3$ or more and an in-plane thermal conductivity of 570 W/mK or more, which comprises carbon black uniformly dispersed among fine graphite particles, a mass ratio of fine graphite particles to carbon black being 75/25 to 95/5, is obtained by repeating plural times a cycle of applying a dispersion of fine graphite particles, carbon black and an organic binder in an organic solvent to a surface of a support plate, and then drying it, to form a resin-containing composite sheet; burning the resin-containing composite sheet to remove the organic binder; and pressing the resultant composite sheet of fine graphite particles and carbon black for densification.

13 Claims, 8 Drawing Sheets

(51) Int. Cl.

| | | |
|---|---|---|
| *B05D 1/02* | (2006.01) | |
| *B05D 3/00* | (2006.01) | |
| *B05D 1/36* | (2006.01) | |
| *B05D 5/00* | (2006.01) | |
| *H05K 1/02* | (2006.01) | |
| *H01L 23/373* | (2006.01) | |
| *C09K 5/14* | (2006.01) | |

(52) U.S. Cl.
CPC ............ *B05D 3/02* (2013.01); *B05D 3/0254* (2013.01); *B05D 3/0272* (2013.01); *B05D 5/00* (2013.01); *B05D 7/52* (2013.01); *C09K 5/14* (2013.01); *H01L 23/373* (2013.01); *H01L 23/3737* (2013.01); *B05D 2401/10* (2013.01); *B05D 2502/00* (2013.01); *B05D 2507/005* (2013.01); *B05D 2508/00* (2013.01); *H01L 2924/0002* (2013.01); *Y10T 428/30* (2015.01)

(58) Field of Classification Search
CPC ..... C04B 35/632; C04B 35/638; C04B 35/64; C01B 32/21; C01B 32/20; C01B 2235/604; C01B 2235/602; H05K 1/0203; H01L 23/3737; H01L 23/373; H01L 2924/0002; Y10T 428/30; B05D 1/02; B05D 1/36; B05D 3/007; B05D 3/02; B05D 3/0254; B05D 3/0272; B05D 5/00; B05D 7/52; B05D 2401/10; B05D 2502/00; B05D 2508/00; B05D 2507/005
See application file for complete search history.

(56) References Cited

U.S. PATENT DOCUMENTS

| | | | |
|---|---|---|---|
| 6,555,271 B1 | 4/2003 | Greinke et al. | |
| 6,776,226 B1* | 8/2004 | Cheng | C09K 5/14 165/185 |
| 7,550,097 B2 | 6/2009 | Tonapi et al. | |
| 9,346,991 B2* | 5/2016 | Arzberger | C09K 5/14 |
| 2002/0164483 A1* | 11/2002 | Mercuri | B32B 18/00 428/408 |
| 2005/0022971 A1* | 2/2005 | Collins | H01L 23/3737 165/80.3 |
| 2005/0045855 A1 | 3/2005 | Tonapi et al. | |
| 2007/0179232 A1* | 8/2007 | Collins | C08L 15/00 524/413 |
| 2010/0176337 A1* | 7/2010 | Zhamu | H01M 4/1391 252/182.1 |
| 2011/0159372 A1* | 6/2011 | Zhamu | H01G 11/38 429/232 |
| 2014/0130540 A1 | 5/2014 | Burk et al. | |
| 2016/0376487 A1* | 12/2016 | Abramson | C09K 5/14 428/408 |

FOREIGN PATENT DOCUMENTS

| | | | | |
|---|---|---|---|---|
| JP | 10-168502 | A | | 6/1998 |
| JP | 10168502 | A * | 6/1998 | |
| JP | 11-1621 | A | | 1/1999 |
| JP | 11001621 | A * | 1/1999 | ............... C08K 7/00 |
| JP | 2005-119887 | A | | 5/2005 |
| JP | 2006-86271 | A | | 3/2006 |
| JP | 2006-188022 | A | | 7/2006 |
| JP | 2006-306068 | A | | 11/2006 |
| JP | 2012-136575 | A | | 7/2012 |
| JP | 2012-211259 | A | | 11/2012 |
| WO | WO 2005/024942 | A1 | | 3/2005 |

OTHER PUBLICATIONS

Tian et al., "Anisotropic Thermal and Electrical Properties of Thin Thermal Interface Layers of Graphite Nanoplatelet-Based Composites," Scientific Reports, 3:1710 (2013) (Year: 2013).*

King et al., "Effects of Carbon Fillers in Thermally Conductive Polypropylene Based Resins," Polymer Composites, vol. 31, No. 3, 497-506 (Apr. 7, 2009) (Year: 2009).*

Extended European Search Report dated Aug. 20, 2015, in European Patent Application No. 14192451.4.

Hu et al., "Flexible graphite modified by carbon black paste for use as a thermal interface material," Carbon (2011), vol. 49, pp. 1075-1086.

Japanese Office Action and Translation for Japanese Patent Application No. 2014-043196 dated Apr. 8, 2014.

King et al., "Effects of Carbon Fillers in Thermally Conductive Polypropylene Based Resins," Polymer Composites (Apr. 7, 2009), vol. 31, No. 3, pp. 497-506.

Translation of Argument for Japanese Patent Application No. 2014-43196 dated Apr. 22, 2014.

* cited by examiner

METHOD FOR PRODUCING HEAT-DISSIPATING SHEET HAVING HIGH THERMAL CONDUCTIVITY

CROSS-REFERENCE TO RELATED APPLICATION

This application is a Divisional of Application Ser. No. 14/539,595 (abandoned as of Feb. 8, 2019 (mailing date of the Notice of Abandonment)) filed on Nov. 12, 2014, which claims priority under 35 U.S.C. § 119(a) to Patent Application Ser. No. 2014-43196 filed in Japan on Mar. 5, 2014. All of the above applications are hereby expressly incorporated by reference into the present application.

FIELD OF THE INVENTION

The present invention relates to a heat-dissipating sheet having high thermal conductivity for efficiently dissipating heat generated from electronic parts, etc. in small electronic appliances such as note-type personal computers, smartphones, mobile phones, etc., and its production method.

BACKGROUND OF THE INVENTION

In small electronic appliances such as note-type personal computers, smartphones, mobile phones, etc., which have been provided with increasingly higher performance and more functions, electronic devices such as microprocessors, imaging chips, memories, etc. should be mounted densely. Accordingly, to prevent malfunction due to heat generated by them, the dissipation of heat generated from such electronic devices has become increasingly important.

As a heat-dissipating sheet for electronic devices, JP 2006-306068 A discloses a heat-conductive sheet comprising at least a graphite film and an adhesive resin composition, which is a reaction-curable vinyl polymer. The graphite film is (a) expanded graphite formed by an expanding method, or (b) obtained by heat-treating a polyimide film, etc., at a temperature of 2400° C. or higher. The expanded graphite film is obtained by immersing graphite in acid such as sulfuric acid, etc. to form a graphite interlayer compound, heat-treating the graphite interlayer compound to foam it, thereby separating graphite layers, washing the resultant graphite powder to remove acid, and rolling the resultant thin-film graphite powder. However, the expanded graphite film has insufficient strength. Also, the graphite film obtained by the heat treatment of a polyimide film, etc. is disadvantageously expensive despite high heat dissipation.

JP 2012-211259 A discloses a heat-conductive sheet comprising graphite pieces, which comprise pluralities of first graphite pieces obtained by thinly cutting a thermally decomposed graphite sheet, and second graphite pieces smaller than the widths of the first graphite pieces, at least the first graphite pieces connecting both surfaces of the heat-conductive sheet. This heat-conductive sheet is obtained, for example, by blending the first and second graphite pieces with a mixture of an acrylic polymer and a solvent, and extruding the resultant blend. However, the extruded heat-conductive sheet does not have sufficient heat dissipation, because of a high volume fraction of the resin.

JP 2006-86271 A discloses a heat-dissipating sheet as thick as 50-150 μm comprising graphite bonded by an organic binder having a glass transition temperature of −50° C. to +50° C., such as an amorphous copolyester, a mass ratio of graphite/organic binder being 66.7/33.3 to 95/5. This heat-dissipating sheet is produced by applying a slurry of graphite and an organic binder in an organic solvent to a parting-agent-coated film on the side of a parting layer, drying the slurry by hot air to remove the organic solvent, and then pressing it, for example, at 30 kg/cm². JP 2006-86271 A describes that the pressing of a graphite/organic binder sheet improves its thermal conductivity. In JP 2006-86271 A, a slurry of graphite and an organic binder in an organic solvent is applied by one operation. It has been found, however, that the application of an entire slurry by one operation provides non-uniform distribution of graphite. In addition, because a mass ratio of graphite to an organic binder is not so high in Examples (80/20 in Example 1, and 89/11 in Example 2), sufficiently high thermal conductivity inherent in graphite is not exhibited.

JP 11-1621 A discloses a high-thermal-conductivity, solid composite material for a heat dissipater comprising highly oriented graphite flakes and a binder polymer polymerized under pressure. This solid composite material is produced by mixing graphite flakes with a thermosetting monomer such as an epoxy resin to prepare a composition comprising at least 40% by volume of graphite, and polymerizing the monomer while compressing the composition under sufficient pressure to align graphite substantially in parallel. JP 11-1621 A describes that a volume fraction of graphite in the composite material is preferably 55-85%, though it may be from 40% to 95%. However, the distribution of graphite flakes is non-uniform in an epoxy resin containing graphite flakes in a high concentration of 95%. Thus, JP 11-1621 A describes only experimental results at a graphite flake volume fraction of 60%.

JP 2012-136575 A discloses a conductive, heat-dissipating sheet comprising organic particles made of polyamides, acrylic resins, etc. and having an average particle size of about 0.1-100 μm, conductive inorganic fillers having an average particle size of about 10 nm to about 10 μm, and a cured resin such as an epoxy resin, etc., organic particles/inorganic fillers being 1000/1 to 10/1, and the percentage of inorganic fillers being 5-30% by weight based on the total amount. JP 2012-136575 A illustrates graphite, coke, carbon black, etc. as inorganic fillers, though only carbon black is used in Examples. However, because the percentage of conductive carbon black is as small as 5-30% by weight, the conductive heat-dissipating sheet of JP 2012-136575 A does not have sufficient heat dissipation.

As described above, conventional heat-dissipating sheets containing a small percentage of graphite or carbon black do not have sufficient heat dissipation despite uniform distribution of graphite or carbon black. Increase in the percentage of graphite or carbon black results in lower sheet strength despite improved thermal conductivity, particularly causing the problem of easy detachment of graphite or carbon black from the heat-dissipating sheet.

In addition, it has been found that a high percentage of graphite particularly causes non-uniform distribution. Because heat-dissipating sheets produced industrially are usually cut to predetermined shapes and sizes and then disposed in small electronic appliances, the non-uniform distribution of graphite provides cut heat-dissipating sheets with unevenness in performance.

Accordingly, inexpensive heat-dissipating sheets having uniform, high heat dissipation as well as mechanical properties necessary for handling are desired.

OBJECT OF THE INVENTION

Accordingly, an object of the present invention is to provide an inexpensive heat-dissipating sheet having uniform, high heat dissipation as well as mechanical properties necessary for handling, and its production method.

DISCLOSURE OF THE INVENTION

As a result of intensive research in view of the above object, the inventor has found that (a) a heat-dissipating sheet comprising a small amount of carbon black uniformly dispersed among fine graphite particles has high thermal conductivity, as well as sufficient mechanical properties for handling, with substantially no detachment of fine graphite particles and carbon black; and (b) such heat-dissipating sheet is obtained by forming a sheet comprising fine graphite particles and carbon black dispersed in a small amount of an organic binder, burning the sheet to remove the organic binder, and pressing the resultant composite sheet of graphite and carbon black for densification. The present invention has been completed based on such findings.

Thus, the heat-dissipating sheet of the present invention has a structure in which carbon black is uniformly dispersed among fine graphite particles, a mass ratio of fine graphite particles to carbon black being 75/25 to 95/5; and the heat-dissipating sheet being obtained by burning and pressing a composite sheet of fine graphite particles, carbon black and an organic binder, so that it has a density of 1.9 g/cm$^3$ or more and an in-plane thermal conductivity of 570 W/mK or more.

The heat-dissipating sheet has thickness of 25-150 μm preferably.

The fine graphite particles preferably have an average diameter of 3-150 μm and average thickness of 200 nm or more.

The carbon black preferably has an average primary particle size of 20-200 nm.

The heat-dissipating sheet is coated with insulating resin layers or insulating plastic films preferably.

The method of the present invention for producing the above heat-dissipating sheet comprises the steps of (1) preparing a dispersion comprising 5-25% by mass in total of fine graphite particles and carbon black, and 0.05-2.5% by mass of an organic binder, in an organic solvent, a mass ratio of the fine graphite particles to the carbon black being 75/25 to 95/5; (2) repeating plural times a cycle of applying the dispersion to a surface of a support plate and then drying it, thereby forming a resin-containing composite sheet comprising the fine graphite particles, the carbon black and the organic binder; (3) burning the resin-containing composite sheet to remove the organic binder; and (4) pressing the resultant composite sheet of fine graphite particles and carbon black for densification.

The mass ratio of the organic binder to the total amount of fine graphite particles and carbon black is preferably 0.01-0.5.

The amount of the dispersion applied by one operation is preferably 5-15 g/m$^2$ (expressed by the total weight of fine graphite particles and carbon black per 1 m$^2$).

The organic binder is preferably an acrylic resin, a polystyrene resin or polyvinyl alcohol.

The organic solvent is preferably at least one selected from the group consisting of ketones, aromatic hydrocarbons and alcohols.

The application of the dispersion is preferably conducted by a spraying method.

The burning step is conducted preferably at a temperature of 550-700° C.

The pressing step is conducted preferably at pressure of 20 MPa or more.

The resin-containing composite sheet is preferably pressed in a state sandwiched by a pair of planar die apparatuses.

The die plate apparatus preferably comprises a lower die plate and an upper die plate. Using the lower die plate as the support plate, the resin-containing composite sheet is formed in a cavity of the lower die plate, burned without being peeled from the lower die plate, and then pressed with the lower die plate combined with the upper die plate.

The after being burnt is preferably cooled gradually to room temperature over 1 hour or more.

The composite sheet of fine graphite particles and carbon black is preferably cooled to a temperature equal to or lower than the freezing point of water, and then pressed.

The pressing step is preferably conducted at a temperature of room temperature to 200° C.

DESCRIPTION OF THE PREFERRED EMBODIMENTS

The embodiments of the present invention will be explained in detail below referring to the attached drawings. Explanations of each embodiment are applicable to other embodiments unless otherwise mentioned. Explanations below are not restrictive, but various modifications may be made within the scope of the present invention.

[1] Heat-dissipating Sheet

Figure 1:
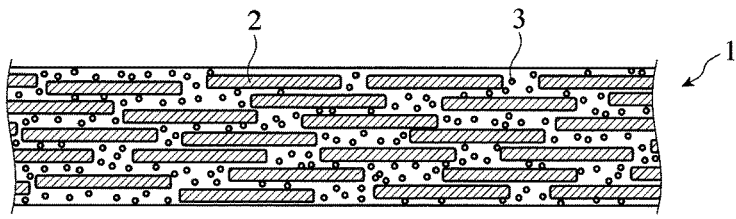
FIG. 1 is a schematic cross-sectional view showing the structure of a heat-dissipating sheet composed of fine graphite particles and carbon black.

As shown in FIG. 1, the heat-dissipating sheet 1 of the present invention is substantially composed of fine graphite particles 2, and carbon black 3 uniformly dispersed among fine graphite particles 2. Though gaps between fine graphite particles 2 and carbon black 3 are exaggerated in FIG. 1 for clarity, the fine graphite particles 2 and the carbon black 3 are actually bonded closely with substantially no gaps.

(1) Fine Graphite Particles

A fine graphite particle has a flake- or plate-like, multi-layer structure, in which benzene rings are two-dimensionally connected. Because the fine graphite particle has a hexagonal lattice structure, each carbon atom is bonded to three carbon atoms, one of four peripheral electrons used for chemical bonding being in a free state (free electron). Because free electrons can move along the crystal lattice, fine graphite particles have high thermal conductivity.

Figure 2:
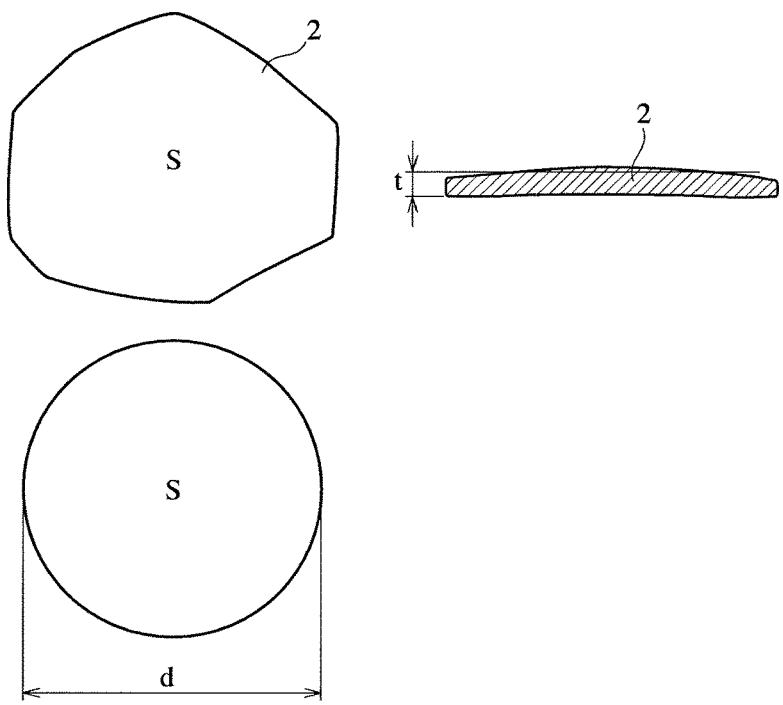
FIG. 2 is a cross-sectional view showing a method for determining the particle size of a fine graphite particle.

Because a fine graphite particle has a flake- or plate-like shape, its size is represented by the diameter of its planar surface. Because a flake-like, fine graphite particle 2 has a planar contour of an irregular shape as shown in FIG. 2, the size (diameter) of each fine graphite particle 2 is defined as a diameter d of a circle having the same area S. Because the size of each fine graphite particle 2 is expressed by a diameter d and a thickness t, the average diameter of fine graphite particles 2 used is expressed by $(\Sigma d)/n$, wherein n represents the number of fine graphite particles 2 measured, and the average thickness of fine graphite particles 2 is expressed by $(\Sigma t)/n$. The diameters d and thickness t of fine graphite particles 2 can be determined by the image treatment of photomicrographs of fine graphite particles 2.

The average diameter of fine graphite particles 2 used in the present invention is preferably in a range of 3-150 μm. When the average diameter of fine graphite particles 2 is less than 3 μm, bonded carbon atoms are not sufficiently long, providing a heat-dissipating sheet 1 with too small thermal conductivity. On the other hand, fine graphite particles 2 having an average diameter of more than 150 μm would make spray coating difficult. The average diameter of fine graphite particles 2 is more preferably 5-100 μm, further preferably 5-50 μm, most preferably 10-30 μm. The average thickness of fine graphite particles 2 is preferably 200 nm or more, more preferably 200 nm to 5 μm, most preferably 200 nm to 1 μm.

(2) Carbon Black

Carbon black 3 usable in the present invention includes furnace black, channel black, acetylene black, arc black, ketjen black, etc. Carbon black 3 preferably has an average primary particle size of 20-200 nm. With carbon black 3 having an average primary particle size of less than 20 nm, agglomeration is likely to occur, making difficult the uniform dispersion of carbon black 3 among fine graphite particles 2. Carbon black 3 having an average primary particle size of more than 200 nm is too large to be uniformly dispersed among fine graphite particles 2. The average primary particle size of carbon black 3 is more preferably 30-100 nm, most preferably 40-80 nm.

(3) Mass Ratio

The mass ratio of fine graphite particles to carbon black is 75/25 to 95/5. Within the above mass ratio range of fine graphite particles to carbon black, a heat-dissipating sheet having as high in-plane thermal conductivity as 570 W/mK or more and sufficient mechanical properties (tensile strength, bendability and cuttability) for handling can be obtained. When fine graphite particles is more than 95% by mass (carbon black is less than 5% by mass), their total amount being 100% by mass, a sufficient effect of adding carbon black cannot be obtained. On the other hand, when fine graphite particles are less than 75% by mass (carbon black is more than 25% by mass), a heat-dissipating sheet having an in-plane thermal conductivity of 570 W/mK or more cannot be obtained. The mass ratio of fine graphite particles to carbon black is preferably 80/20 to 95/5, more preferably 82.5/17.5 to 90/10.

(4) Thickness

To secure sufficient cooling power, the heat-dissipating sheet is preferably as thick as 25-150 μm. When it is thinner than 25 μm, the heat-dissipating sheet has insufficient cooling power despite high thermal conductivity. Even if the heat-dissipating sheet were thicker than 150 μm, further improvement in the cooling power would not be expected. The preferred thickness of the heat-dissipating sheet is 40-100 μm for practical purposes.

(5) Density

The heat-dissipating sheet of the present invention has a density of 1.9 g/cm$^3$ or more. Because fine graphite particles have a density of 2.25±0.05 g/cm$^3$, the heat-dissipating sheet of the present invention has a density extremely close to that of fine graphite particles, thereby having thermal conductivity close to the inherent thermal conductivity of graphite. The density of the heat-dissipating sheet of the present invention is preferably 1.9-2.2 g/cm$^3$.

(6) Thermal Conductivity

As described above, because the heat-dissipating sheet of the present invention has a structure in which carbon black is uniformly dispersed among fine graphite particles, and has a density of 1.9 g/cm$^3$ or more, it has thermal conductivity of 570 W/mK or more in an in-plane direction. The thermal conductivity in an in-plane direction may be called simply "in-plane thermal conductivity." The "in-plane direction" is an XY direction in parallel with a surface (XY plane) of the heat-dissipating sheet, and the "thickness direction" is a Z direction perpendicular to the XY plane. The heat-dissipating sheet of the present invention preferably has thermal conductivity of 600 W/mK or more in an in-plane direction, and about 10 W/mK or more in a thickness direction.

[2] Production Method of Heat-dissipating Sheet (1) Preparation of Dispersion

A dispersion of fine graphite particles, carbon black and an organic binder in an organic solvent is first prepared. Because fine graphite particles are easily agglomerated, it is preferable to mix a dispersion of fine graphite particles in an organic solvent with a dispersion of carbon black in an organic solvent and a solution of an organic binder in an organic solvent. With the entire dispersion as 100% by mass, the total amount of fine graphite particles and carbon black is 5-25% by mass. When the total amount of fine graphite particles and carbon black is less than 5% by mass, too thin a resin-containing composite sheet is obtained by one operation, resulting in too many steps of applying the dispersion, and thus too low a production efficiency of a heat-dissipating sheet. On the other hand, when the total amount of fine graphite particles and carbon black is more than 25% by mass, the concentrations of fine graphite particles and carbon black are too high in the dispersion, likely causing agglomeration. The preferred total amount of fine graphite particles and carbon black is 8-20% by mass, as long as the mass ratio of fine graphite particles to carbon black is in a range of 75/25 to 95/5 as described above.

The mass ratio of the organic binder to the total amount of fine graphite particles and carbon black is 0.01-0.5. When the mass ratio of organic binder/(fine graphite particles+ carbon black) is less than 0.01, the dispersion does not have enough viscosity for efficient spraying, and the resultant resin-containing composite sheet is not sufficiently integral, making its handling difficult. When the above mass ratio is more than 0.5, it takes too much time to burn off the organic binder in a subsequent burning step, resulting in low production efficiency of a heat-dissipating sheet. The mass ratio of organic binder/(fine graphite particles+carbon black) is preferably 0.02-0.3, more preferably 0.03-0.2.

The organic binder used in the present invention is not particularly restricted, as long as it can be dissolved in an organic solvent to uniformly disperse fine graphite particles and carbon black, and easily removed by burning. Such organic binders include, for example, acrylic resins such as polymethylacrylate and polymethylmethacrylate, polystyrenes, polycarbonates, polyvinyl chloride, ABS resins, etc. Among them, polymethylmethacrylate and polystyrenes are preferable.

The organic solvent used in the dispersion is preferably an organic solvent capable of well dispersing fine graphite particles and carbon black and dissolving an organic binder, and volatile enough to shorten the drying time. Examples of such organic solvents include ketones such as methyl ethyl ketone, aliphatic hydrocarbons such as hexane, aromatic hydrocarbons such as xylene, alcohols such as isopropyl alcohol, etc. Among them, methyl ethyl ketone, xylene, etc. are preferable. They may be used alone or in combination.

(2) Application and Drying of Dispersion

Figure 3:
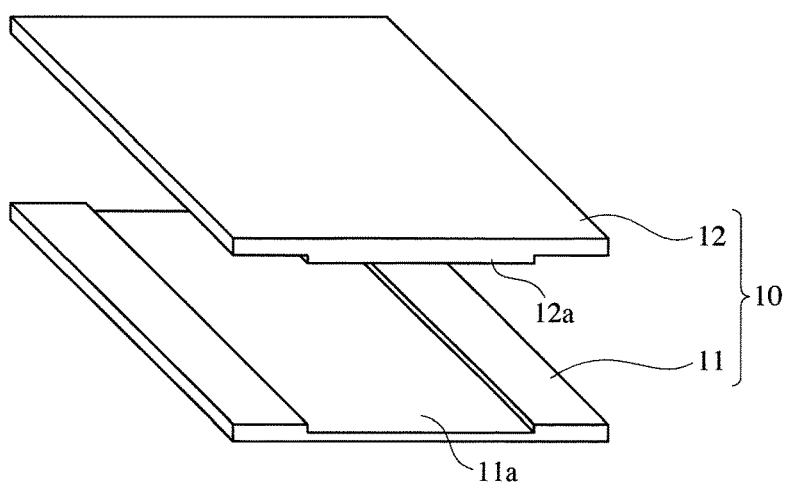
FIG. 3 is a perspective view showing a die plate apparatus capable of conducting the application of a dispersion of fine graphite particles, carbon black and an organic binder, the burning of a resin-containing composite sheet, and the pressing of a composite sheet of fine graphite particles and carbon black.

The dispersion is applied to a surface of a support plate. When a resin-containing composite sheet formed on a surface of the support plate is burned in a subsequent step, and then pressed, the support plate is conveniently a planar die apparatus 10 shown in FIG. 3. The planar die apparatus 10 comprises a lower die plate 11 having a flat cavity 11a, and an upper die plate 12 having a projection 12a having a complementary shape to the cavity 11a. In the depicted example, the cavity 11a is open at both ends, though not restrictive.

Figure 4:
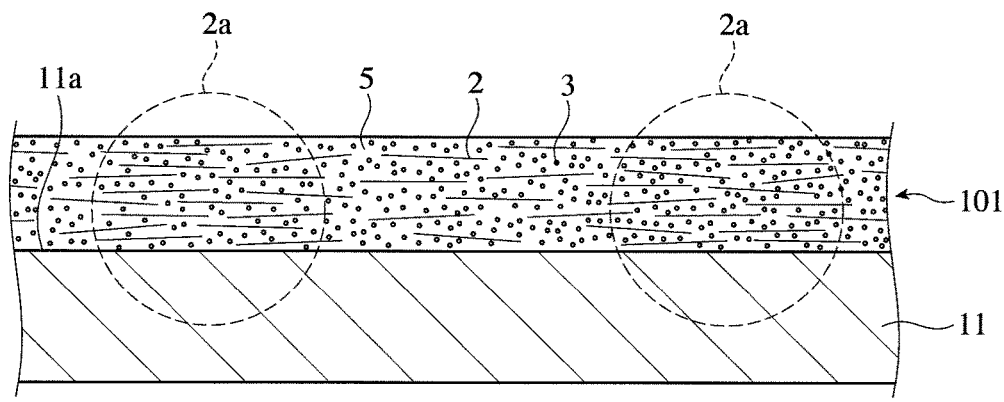
FIG. 4 is a cross-sectional view schematically showing a thick coating of a dispersion of fine graphite particles, carbon black and an organic binder on a support (lower die plate), in which fine graphite particles are agglomerated.
Figure 5:
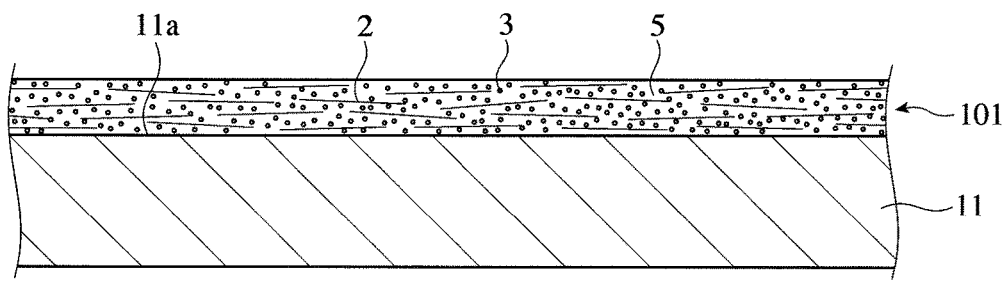
FIG. 5 is a cross-sectional view schematically showing a thin coating of the dispersion on a support (lower die plate), in which fine graphite particles and carbon black are uniform dispersed.

When a necessary amount of a dispersion is applied by one operation as schematically shown in FIG. 4, fine graphite particles 2 and carbon black 3 in the dispersion 5 are agglomerated in a drying process (region 2a). Intensive research has revealed that when the dispersion 5 is divided to as small amounts of lots as possible to carry out plural application operations, the agglomeration of fine graphite particles 2 and carbon black 3 can be prevented. In the first application shown in FIG. 5, a dispersion layer 101 is formed by a small amount of the dispersion, and its thickness is sufficiently small to the average diameter of fine graphite particles 2. Accordingly, when the dispersion layer 101 is dried, the dispersed state of fine graphite particles 2 and carbon black 3 is kept without agglomeration. Accordingly, fine graphite particles 2 and carbon black 3 bonded with an extremely small amount of the organic binder are substantially uniformly distributed in a coating layer (resin-containing composite sheet layer) 101' obtained by drying the dispersion layer 101.

Figure 7:
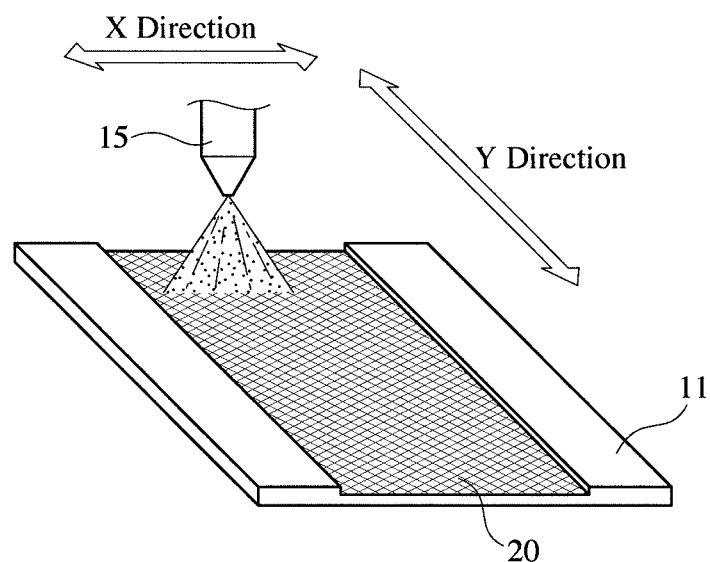
FIG. 7 is a perspective view showing the application of a dispersion to a cavity of a lower die plate in a planar die apparatus.

The amount of the dispersion 5 applied by one operation is preferably 5-15 g/m², more preferably 7-12 g/m², as the total amount of fine graphite particles 2 and carbon black 3 per a unit area. When the amount of the dispersion 5 applied is less than 5 g/m², it takes too much time to form a resin-containing composite sheet. On the other hand, when it is more than 15 g/m², fine graphite particles 2 and carbon black 3 are easily agglomerated. To apply such a small amount of the dispersion 5 uniformly, a spraying method using a nozzle 15 as shown in FIG. 7 is preferable. With the nozzle 15 moved in horizontal directions (X and Y directions), it is preferable to spray the dispersion 5 for uniform thickness.

After the dispersion layer 101 is dried, the next application operation is conducted. The dispersion layer 101 may be spontaneously dried, or by heating to shorten the drying time. The heating temperature may be determined depending on the boiling point of an organic solvent used. For example, when a mixed solvent of xylene and isopropyl alcohol, or methyl ethyl ketone is used, the heating temperature is preferably 30-100° C., more preferably 40-80° C. The drying need not be conducted until an organic solvent in the applied dispersion layer 101 is completely evaporated, but may be conducted to such an extent that fine graphite particles 2 and carbon black 3 are not diffused from the dispersion layer 101 in the next application operation.

Figure 6:
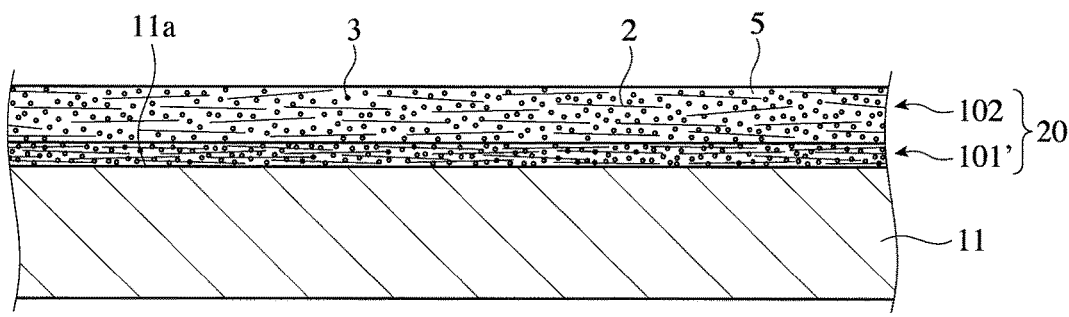
FIG. 6 is a cross-sectional view schematically showing a thin coating of a dispersion formed on a dried dispersion on a support (lower die plate).

When the second application of the dispersion 5 is conducted onto the dried coating layer (resin-containing composite sheet layer) 101', a new dispersion layer 102 is formed substantially without dissolving the dried coating layer 101' as schematically shown in FIG. 6. The number of cycles of applying and drying the dispersion 5 may be determined depending on the thickness of a resin-containing composite sheet to be formed. Applying such a small amount of a dispersion 5 plural times provides a resin-containing composite sheet 20 (FIG. 7), in which fine graphite particles 2 and carbon black 3 are sufficiently uniformly distributed.

(3) Burning

The resin-containing composite sheet 20 is burned to remove the organic binder. When the resin-containing composite sheet 20 is formed in a cavity 11a of a lower die plate 11 in a planar die apparatus 10, the resin-containing composite sheet 20 is preferably charged into a furnace (not shown) together with the lower die plate 11. The furnace may be an electric furnace, a gas furnace, or a continuous furnace in which the resin-containing composite sheet 20 in the lower die plate 11 is conveyed on a belt conveyor. In the case of a continuous furnace, a gradually-cooling furnace is preferably positioned at the end of the continuous furnace, to secure gradual cooling described later.

The burning temperature is preferably 550-750° C. When the burning temperature is lower than 550° C., the removal of the organic binder takes too much time, and the resultant heat-dissipating sheet cannot have sufficiently high thermal conductivity. On the other hand, when the burning temperature is higher than 750° C., carbon black may be burned out at least partially, resulting in a heat-dissipating sheet with insufficient thermal conductivity. The preferred burning temperature is 600-700° C.

The resin-containing composite sheet 20 is burned preferably in an atmosphere sufficiently containing oxygen, for example, in the air. In an oxygen-containing atmosphere (air), the organic binder is rapidly burned out without leaving a carbonized binder. However, burning in an inert gas such as a nitrogen gas tends to carbonize the organic binder, providing a heat-dissipating sheet with low thermal conductivity. The oxygen content in the atmosphere is preferably 10% or more, more preferably 15% or more.

The burning time of the resin-containing composite sheet 20 in the above temperature range in an oxygen-containing atmosphere is generally 5-30 minutes, though variable depending on the burning temperature. The burning time is a time period in which the resin-containing composite sheet 20 is kept at the burning temperature, without including the temperature elevation time and the cooling time. When the burning time is less than 5 minutes, the organic binder is not completely burned out. When the burning time is more than 30 minutes, carbon black is excessively exposed to high temperatures, so that carbon black may be burned out at least partially, resulting in a heat-dissipating sheet with insufficient thermal conductivity. The preferred burning time is 7-15 minutes.

(4) Cooling

A composite sheet 21 of fine graphite particles and carbon black obtained by burning the resin-containing composite sheet 20 is preferably gradually cooled in the furnace. It has been found that when the composite sheet 21 of fine graphite particles and carbon black is left to cool outside the furnace, the resultant heat-dissipating sheet tends to have low thermal conductivity. The composite sheet 21 of fine graphite particles and carbon black is preferably gradually cooled over 1 hour or more in the furnace. The cooling speed is preferably 15° C./minute or less, more preferably 10° C./minute or less.

It has been found that when the composite sheet 21 of fine graphite particles and carbon black is cooled to a temperature equal to or lower than the freezing point of water before pressing, the heat-dissipating sheet exhibits high thermal conductivity in a wide range of the carbon black content. The cooling temperature may be 0° C. or lower, and is preferably −5° C. or lower. When cooled to a temperature equal to or lower than the freezing point of water, moisture in the air is likely frozen on the composite sheet 21. Accordingly, cooling is conducted preferably in a dry atmosphere. The cooling time is not particularly restricted, but may be 10 minutes or more.

(5) Pressing

Figure 8:
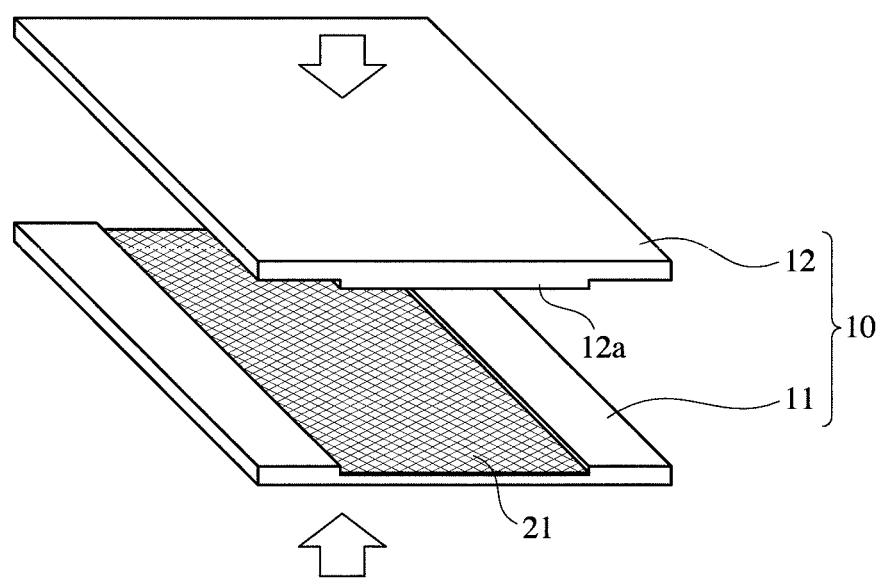
FIG. 8 is a perspective view showing the pressing of a composite sheet of fine graphite particles and carbon black in a state sandwiched by a planar die apparatus.
Figure 9:
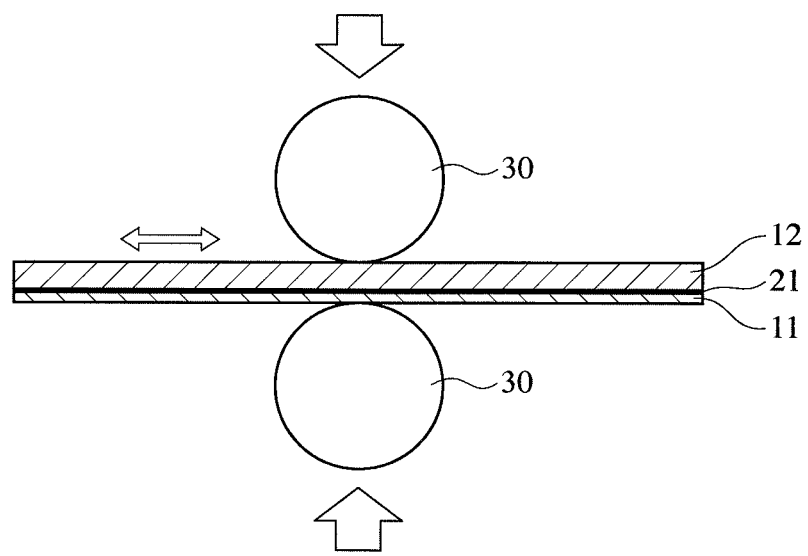
FIG. 9 is a partially cross-sectional side view showing the roll-pressing of a composite sheet of fine graphite particles and carbon black in a state sandwiched by a planar die apparatus.

As shown in FIG. 8, a composite sheet 21 of fine graphite particles and carbon black obtained by burning the resin-containing composite sheet 20 on the lower die plate 11 is pressed by combining the lower die plate 11 with the upper die plate 12, such that a projection 12*a* of the upper die plate 12 is pressed onto the composite sheet 21 in the cavity 11*a* of the lower die plate 11. The lower die plate 11 and the upper die plate 12 may be pressed by a pressing apparatus, or by a pair of rolls 30, 30 with the composite sheet 21 sandwiched by the lower die plate 11 and the upper die plate 12 as shown in FIG. 9. Pressure applied to the lower die plate 11 and the upper die plate 12 is preferably 20 MPa or more. Pressing is not limited to once, but may be conducted plural times. Pressing may be conducted at room temperature, or at high temperature up to 200° C. to increase the pressing efficiency.

During pressing, the lower die plate 11 and the upper die plate 12 are preferably vibrated via rolls 30. Vibration promotes the densification of the composite sheet 21 of fine graphite particles and carbon black even under the same pressure. The vibration frequency may be about 100-500 Hz. Vibration may be added by a vibration motor.

Figure 10:
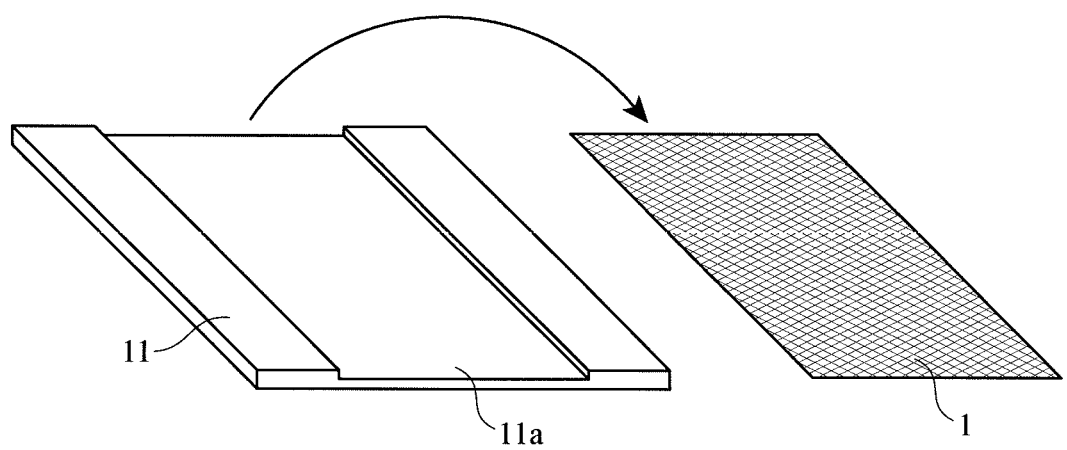
FIG. 10 is a perspective view showing the peeling of a heat-dissipating sheet obtained by pressing from a lower die plate.

The heat-dissipating sheet 1 obtained by pressing the composite sheet 21 of fine graphite particles and carbon black is peeled from the lower die plate 11 as shown in FIG. 10. Because of uniform dispersion of carbon black 3 among fine graphite particles 2 and densification by pressing, the heat-dissipating sheet 1 is neither broken nor cracked when peeled from the lower die plate 11. The heat-dissipating sheet 1 thus obtained has sufficient bendability, so that it is not broken or fractured even when bent, for example, to 90° with a radius of curvature of 2 cm.

(6) Cutting of Heat-dissipating Sheet

When a large heat-dissipating sheet 1 is formed by the above process, it should be cut to a proper size so that it can be attached to a small electronic appliance. Because of uniform dispersion of carbon black 3 among fine graphite particles 2, the heat-dissipating sheet 1 of the present invention cut by an ordinary cutter has a sharp cut surface without raggedness.

(7) Surface Coating of Heat-dissipating Sheet

The heat-dissipating sheet 1 of the present invention comprising fine graphite particles and carbon black is preferably coated with an insulating resin or a plastic film, to prevent the detachment of fine graphite particles and carbon black and to achieve surface insulation. The insulating resins are preferably thermoplastic resins soluble in organic solvents, for example, acrylic resins such as polymethylmethacrylate, polystyrenes, polycarbonates, polyvinyl chloride, polyurethanes, etc. The insulating plastic films may be made of polyolefins such as polyethylene and polypropylene, polyesters such as polyethylene terephthalate, polyamides such as nylons, polyimides, etc. The insulating plastic film preferably has a heat-sealing layer. As long as the functions of preventing the detachment of fine graphite particles and carbon black and adding insulation are exhibited, the thickness of the insulating resin coating and the insulating plastic film may be several micrometers to about 20 µm. Surface coating may be preferably conducted after cutting the heat-dissipating sheet 1 to a desired size, to surely prevent the detachment of fine graphite particles and carbon black from the cut surface of the heat-dissipating sheet 1.

[4] Heat Dissipation Test

Figure 11:
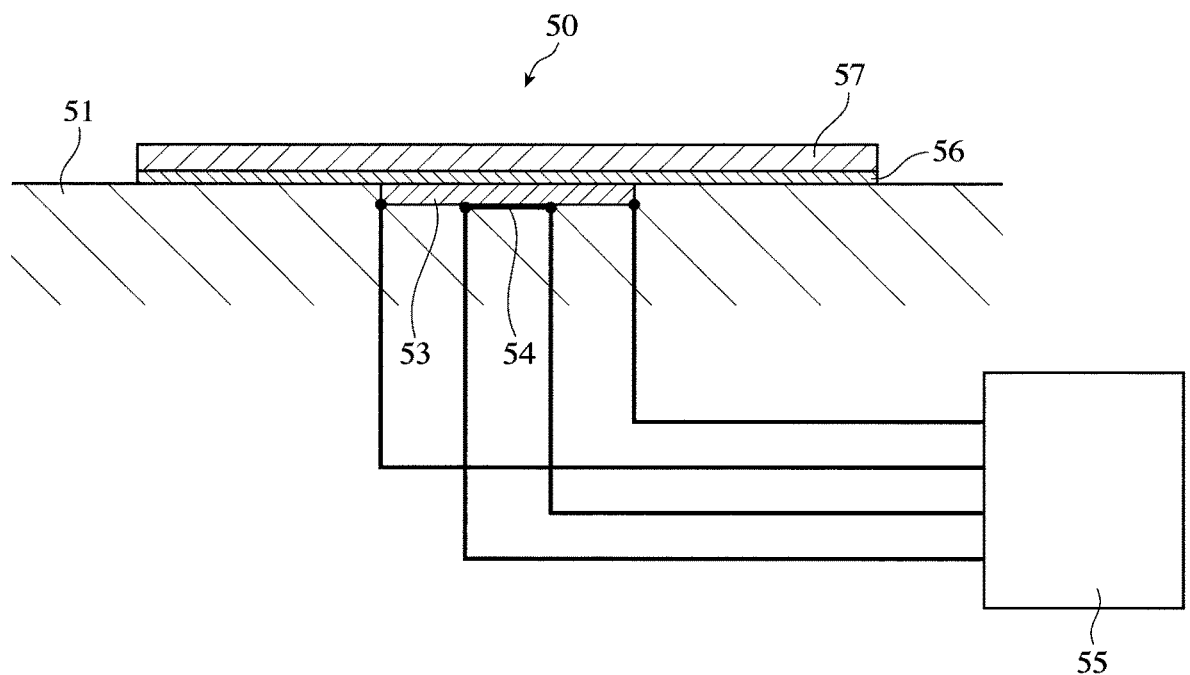
FIG. 11 is a schematic cross-sectional view showing a heat dissipation test apparatus of a heat-dissipating sheet.
Figure 12:
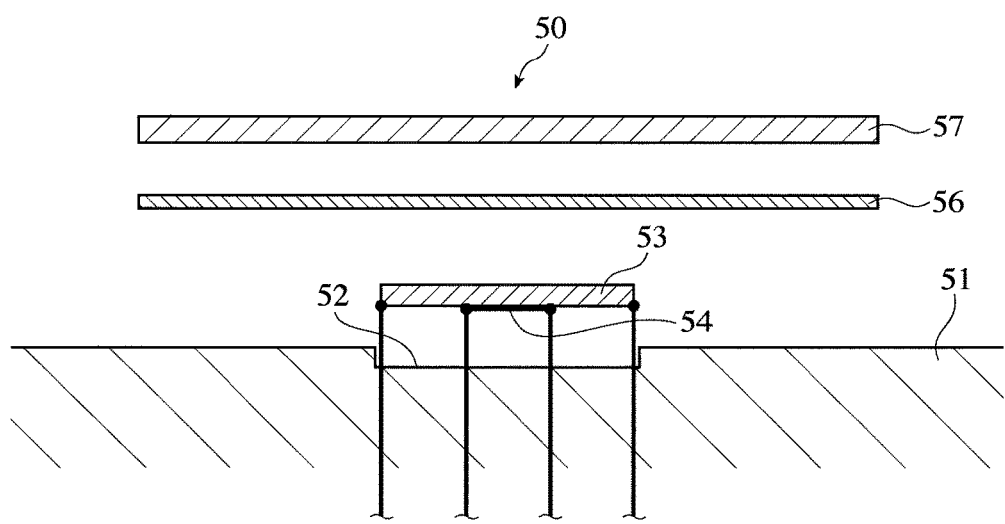
FIG. 12 is an exploded view of FIG. 11.
Figure 13:
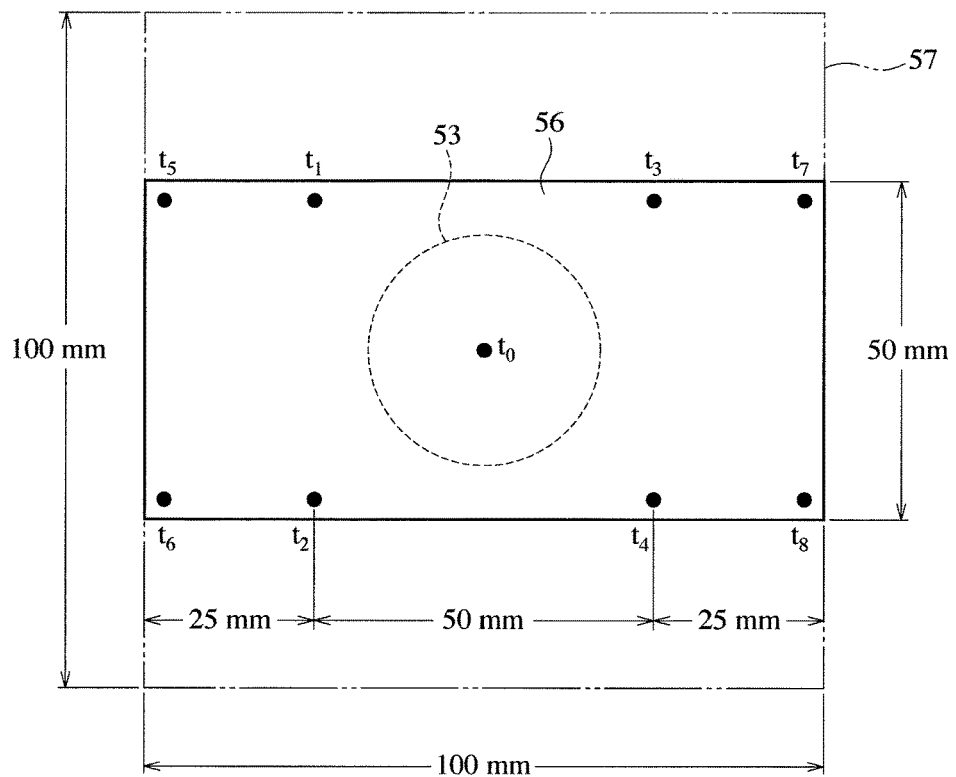
FIG. 13 is a plan view showing temperature-measuring points on a heat-dissipating sheet test piece set in a heat dissipation test apparatus.

The heat dissipation test of the heat-dissipating sheet of the present invention may be conducted by an apparatus 50 shown in FIGS. 11-13. This heat dissipation test apparatus 50 comprises a heat-insulating, electric-insulating table 51 having an annular recess 52, a circular plate heater 53 received in the annular recess 52, temperature-measuring thermocouples 54 attached to a lower surface of the heater 53, a temperature controller 55 connected to the heater 53 and the temperature-measuring thermocouples 54, and a 1-mm-thick acrylic plate (100 mm×100 mm) 57 covering a test piece 56 of 50 mm×100 mm of the heat-dissipating sheet 1 placed on the table 51, at such a position that the heater 53 is located at a center of the acrylic plate 57. The test piece 56 has nine temperature-measuring points $t_0$-$t_8$ at positions shown in FIG. 13, a temperature measured at the point $t_0$ being the highest temperature (Tmax), an average of temperatures measured at the points $t_1$,$t_4$ being an intermediate temperature (Tm), an average of temperatures measured at the points $t_5$-$t_8$ being the lowest temperature (Tmin), and an average of Tm and Tmin being an average temperature (Tav).

The present invention will be explained in more detail with Examples below without intention of restricting the present invention thereto.

EXAMPLE 1

100 parts by mass in total of 85% by mass of fine graphite particles (UP-35N available from Nippon Graphite Industries Ltd., ash: less than 1.0%, average size: 25 μm), and 15% by mass of carbon black (acetylene black, average primary particle size: 42 nm) were mixed with 10 parts by mass of polymethylmethacrylate (PMMA) as an organic binder, and a mixed solvent of xylene/isopropyl alcohol (mass ratio: 6/4) as an organic solvent, to prepare a dispersion of fine graphite particles, carbon black and an organic binder in an organic solvent. The composition of the dispersion comprised 12.00% by mass of fine graphite particles, 2.12% by mass of carbon black, 1.41% by mass of the organic binder, and 84.47% by mass of the organic solvent. A small portion of this dispersion was cast into a cavity $11a$ of a lower die plate 11 in the SUS-made planar die apparatus 10 shown in FIG. 3, and dried at 40° C. for 3 minutes to form a resin-containing composite sheet layer 101' of fine graphite particles, carbon black and PMMA having a thickness of 10 g/m$^2$ (expressed by the total amount of fine graphite particles and carbon black per 1 m$^2$). The next dispersion as thick as 10 g/m$^2$ was applied to the dried resin-containing composite sheet layer 101', and then dried. Such application of the dispersion was repeated 10 times in total, to produce a resin-containing composite sheet 20 having a final thickness.

The resin-containing composite sheet 20 kept in the lower die plate 11 was introduced into an electric furnace, and burned at 650° C. for 10 minutes in an air atmosphere to remove the organic binder. The resultant composite sheet 21 of fine graphite particles and carbon black was gradually cooled over about 3 hours in the electric furnace.

The lower die plate 11 containing the composite sheet 21 of fine graphite particles and carbon black in the cavity $11a$ was combined with an upper die plate 12 having a projection $12a$ having a complementary shape to the lower die plate 11, such that the projection $12a$ of the upper die plate 12 came into contact with the composite sheet 21 of fine graphite particles and carbon black, and caused to pass through a gap between a pair of rolls 30, 30 rotating at a peripheral speed of 30 cm/minute 4 times, to press the composite sheet 21 of fine graphite particles and carbon black at linear pressure of 20 MPa or more each time, as shown in FIG. 9. During pressing, vibration at a frequency of 200 Hz was applied by one roll 30.

After pressing, a heat-dissipating sheet 1 could be taken out of the lower die plate 11 without breakage. The heat-dissipating sheet 1 thus obtained had a thickness of 111 μm and a density of 2.13 g/cm$^3$. A test piece of 50 mm×100 mm was cut out of this heat-dissipating sheet 1, and set in the apparatus shown in FIGS. 11-13 to conduct a heat dissipation test at room temperature (23.6° C.). The test piece was heated at 72° C. (hot spot) by the heater 53. After reaching an equilibrium state, the temperature at each point of the heat-dissipating sheet test piece was as follows:

$t_0$: 47.4° C.,
$t_1$: 42.7° C.,
$t_2$: 42.2° C.,
$t_3$: 41.9° C.,
$t_4$: 42.3° C.,
$t_5$: 39.3° C.,
$t_6$: 38.3° C.,
$t_7$: 37.1° C., and
$t_8$: 37.2° C.

Thus, the highest temperature Tmax was 47.4° C. (hot spot), the intermediate temperature Tm was (42.7° C.+42.2° C.+41.9° C.+42.3° C.)/4=42.3° C., the lowest temperature Tmin was (39.3° C.+38.3° C.+37.1° C.+37.2° C.)/4=38.0° C., and the average temperature Tav was (Tm+Tmin)/2=40.2° C.

The thermal conductivity (W/mK) of the heat-dissipating sheet 1 was calculated as a product of thermal diffusivity (m$^2$/s) measured by a laser flash method and heat capacity (density×specific heat). The specific heat was regarded as 750. As a result, the thermal conductivity of the heat-dissipating sheet 1 was 625 W/mK in an in-plane direction and 10 W/mK in a thickness direction.

When this heat-dissipating sheet 1 was bent to 90° with a radius of curvature of 2 cm, no breakage occurred. The heat-dissipating sheet 1 cut by scissors had a clear-cut surface with substantially no fine graphite particles and carbon black detached.

Comparative Example 1

The same heat dissipation test as in Example 1 was conducted on a graphite sheet PGS as thick as 70 μm (available from Panasonic Corporation). As a result, the temperature at each point of a test piece of the heat-dissipating sheet was as follows:

$t_0$: 48.7° C.,
$t_1$: 42.7° C.,
$t_2$: 43.3° C.,
$t_3$: 42.4° C.,
$t_4$: 42.1° C.,
$t_5$: 38.4° C.,
$t_6$: 38.1° C.,
$t_7$: 38.1° C., and
$t_8$: 38.0° C.

Thus, the highest temperature Tmax was 48.7° C. (hot spot), the intermediate temperature Tm was (42.7° C.+43.3° C.+42.4° C.+42.1° C.)/4=42.6° C., the lowest temperature Tmin was (38.4° C.+38.1° C.+38.1° C.+38.0° C.)/4=38.2° C., and the average temperature Tav was (Tm+Tmin)/2=40.4° C. Comparison with Example 1 revealed that the graphite sheet of Comparative Example 1 was poorer than the heat-dissipating sheet of Example 1 in any of the highest temperature Tmax, the lowest temperature Tmin and the average temperature Tav.

EXAMPLE 2

A dispersion of fine graphite particles, carbon black and an organic binder in an organic solvent was prepared in the same manner as in Example 1, except for changing the mass ratio of fine graphite particles to carbon black to 87.5/12.5. The dispersion comprised 12.0% by mass of fine graphite particles, 1.71% by mass of carbon black, 1.37% by mass of an organic binder, and 84.92% by mass of an organic solvent. Using this dispersion, a heat-dissipating sheet 1 was produced in the same manner as in Example 1. This heat-dissipating sheet 1 had thermal conductivity of 645 W/mK in an in-plane direction and 10 W/mK in a thickness direction.

When this heat-dissipating sheet 1 was bent to 90° with a radius of curvature of 2 cm, no breakage occurred as in Example 1. The heat-dissipating sheet 1 cut by scissors had a clear-cut surface with substantially no fine graphite particles and carbon black detached as in Example 1.

Figure 14:
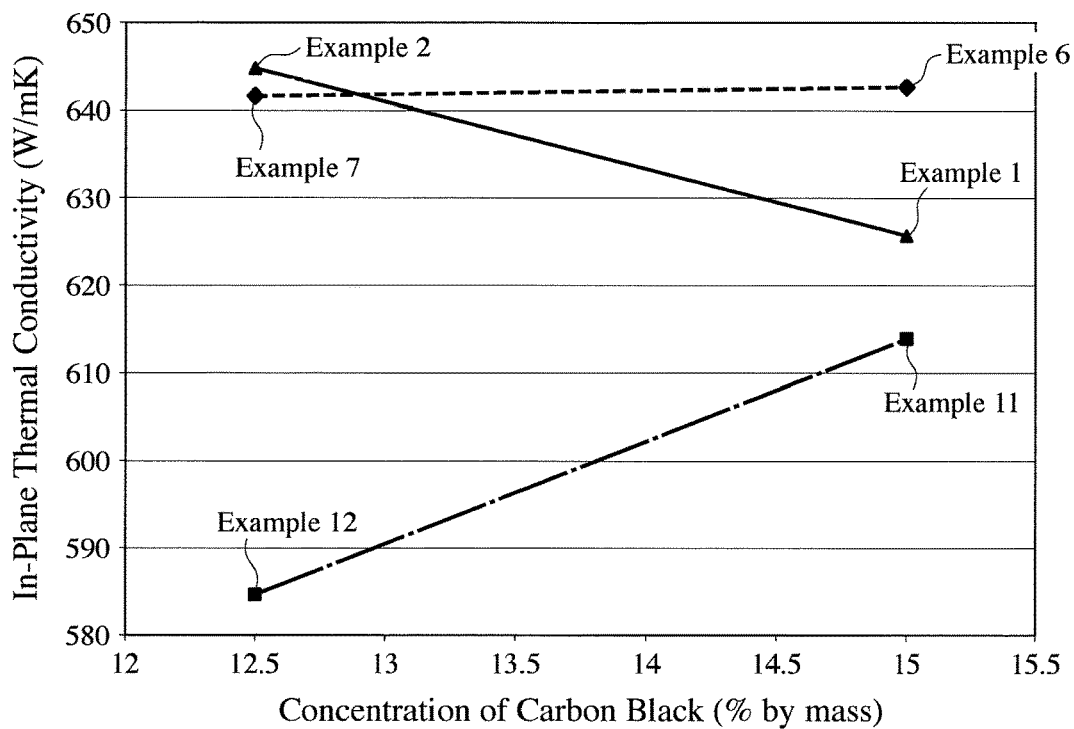
FIG. 14 is a graph showing the relation between the concentration of carbon black and in-plane thermal conductivity in the heat-dissipating sheets of Examples 1, 2, 6, 7, 11 and 12.

FIG. 14 shows the relation between in-plane thermal conductivity and the concentration of carbon black in the heat-dissipating sheet 1 of Examples 1 and 2. It is clear from FIG. 14 that a higher percentage of fine graphite particles provide higher thermal conductivity.

Examples 3-5 and Comparative Example 2

Figure 15:
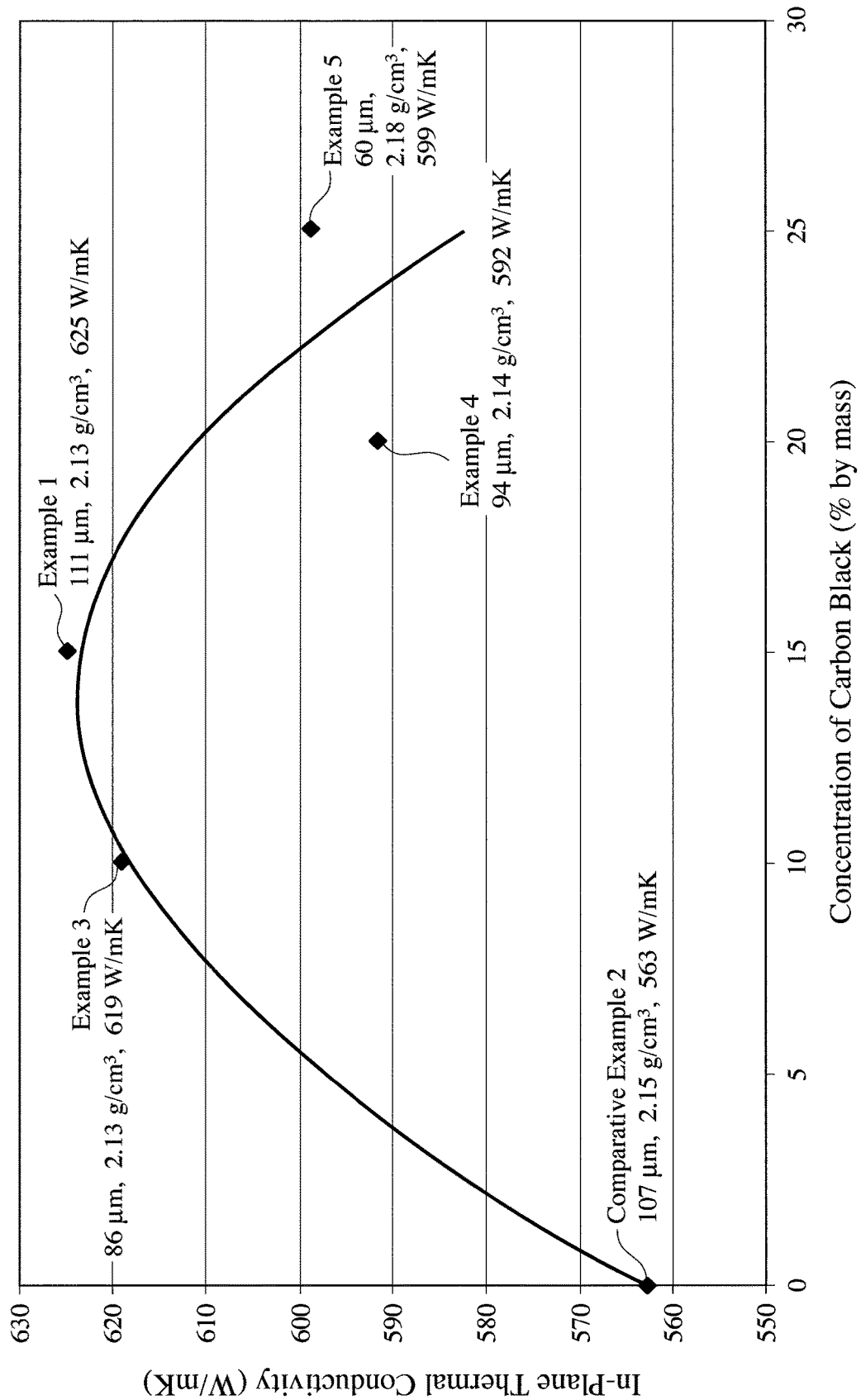
FIG. 15 is a graph showing the relation between the concentration of carbon black and in-plane thermal conductivity in the heat-dissipating sheets of Examples 1 and 3-5 and Comparative Example 2.

Heat-dissipating sheets were produced in the same manner as in Example 1, except for changing the amount of carbon black in the total amount (100% by mass) of fine graphite particles and carbon black to 0% by mass (Comparative Example 2), 10% by mass (Example 3), 20% by mass (Example 4) and 25% by mass (Example 5), and their thickness, densities and in-plane thermal conductivities were measured. The thickness, densities and in-plane thermal conductivities of the heat-dissipating sheets of Examples 3-5 and Comparative Example 2 are shown in FIG. 15 together with those of Example 1. It is clear from FIG. 15 that the heat-dissipating sheets of Examples 1 and 3-5 containing carbon black have higher in-plane thermal conductivities than that of the heat-dissipating sheet of Comparative Example 2 containing no carbon black.

When the heat-dissipating sheets 1 of Examples 3-5 were bent to 90° with a radius of curvature of 2 cm, no breakage occurred as in Example 1. The heat-dissipating sheets 1 cut by scissors had clear-cut surfaces with substantially no fine graphite particles detached as in Example 1. On the other hand, the heat-dissipating sheet 1 of Comparative Example 2 was broken by the above bending test, and fine graphite particles were extremely detached from the cut surface in a cutting test by scissors.

EXAMPLES 6 and 7

The composite sheets 21 of fine graphite particles and carbon black produced in Examples 1 and 2 were frozen at −5° C. for 30 minutes, and then pressed under the same conditions as in Example 1. The resultant heat-dissipating sheets were measured with respect to in-plane thermal conductivity. The results are shown in FIG. 14. As is clear from FIG. 14, the heat-dissipating sheet of Example 6 pressed after the freezing treatment had higher thermal conductivity than that of the heat-dissipating sheet of Example 1.

When the heat-dissipating sheets 1 of Examples 6 and 7 were bent to 90° with a radius of curvature of 2 cm, no breakage occurred as in Example 1. The heat-dissipating sheets 1 cut by scissors had clear-cut surfaces with substantially no fine graphite particles detached as in Example 1.

EXAMPLES 8-10

Figure 16:
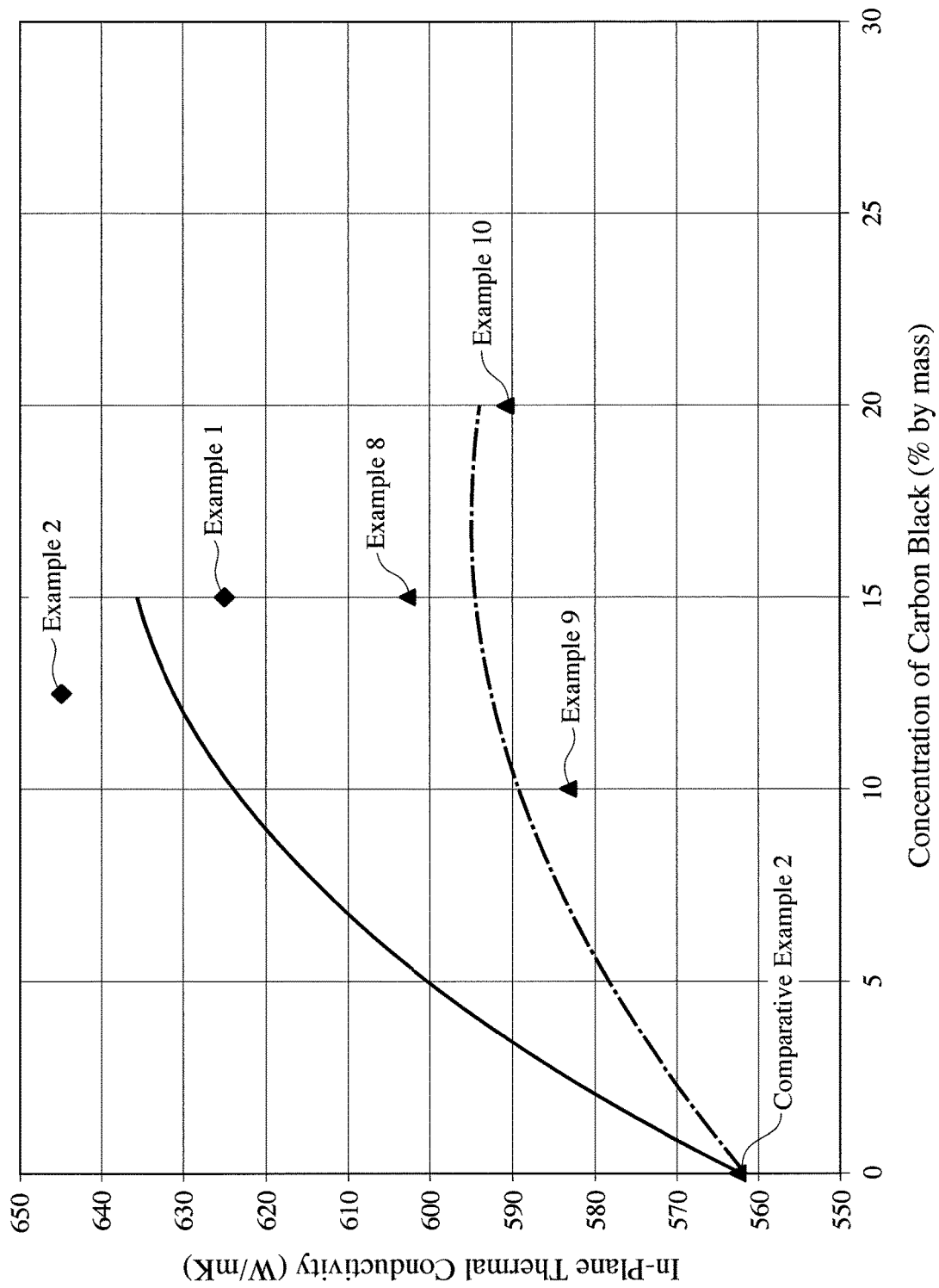
FIG. 16 is a graph showing the relation between the concentration of carbon black and in-plane thermal conductivity in the heat-dissipating sheets of Examples 1, 2 and 8-10 and Comparative Example 2.

Heat-dissipating sheets were produced in the same manner as in Example 1, except for using carbon black having as large an average primary particle size as 85 nm, and changing the amount of carbon black per the total amount (100% by mass) of fine graphite particles and carbon black to 10% by mass (Example 9), 15% by mass (Example 8), and 20% by mass (Example 10), respectively, and their thermal conductivities were measured. The results are shown in FIG. 16 together with those of Examples 1 and 2 and Comparative Example 2. It is clear from FIG. 16 that a larger average primary particle size provides the heat-dissipating sheet with a lower in-plane thermal conductivity, and that a higher concentration of carbon black provides the heat-dissipating sheet with a larger in-plane thermal conductivity.

When the heat-dissipating sheets 1 of Examples 8-10 were bent to 90° with a radius of curvature of 2 cm, no breakage occurred as in Example 1. The heat-dissipating sheets 1 cut by scissors had clear-cut surfaces with substantially no fine graphite particles detached as in Example 1.

EXAMPLES 11 and 12

Heat-dissipating sheets 1 were produced and their thermal conductivities were measured in the same manner as in Example 1, except that the resin-containing composite sheet 20 was taken out of an electric furnace after burning and left to cool in the air. The results are shown in FIG. 14. It is clear from FIG. 14 that the heat-dissipating sheets 1 of Examples 11 and 12 taken out of the furnace after being burnt and then left to cool had lower thermal conductivities than those of the heat-dissipating sheets 1 of Examples 1 and 2 gradually cooled in the furnace after being burnt, while meeting the requirement of 570 W/mK or more, even though they had the same composition.

When the heat-dissipating sheets 1 of Examples 11 and 12 were bent to 90° with a radius of curvature of 2 cm, no breakage occurred as in Example 1. The heat-dissipating sheets 1 cut by scissors had clear-cut surfaces with substantially no fine graphite particles detached as in Example 1.

EFFECTS OF THE INVENTION

Because the heat-dissipating sheet of the present invention has a structure in which carbon black is uniformly dispersed among fine graphite particles, a mass ratio of fine graphite particles to carbon black being 75/25 to 95/5, and has a density of 1.9 g/cm$^3$ or more, it has as high in-plane thermal conductivity as 570 W/mK or more. Also, because fine carbon black is uniformly dispersed among fine graphite particles, the heat-dissipating sheet of the present invention has uniform thermal conductivity as well as sufficient mechanical properties for handling. Such a uniform, high-density heat-dissipating sheet is obtained by applying a small amount of a dispersion comprising fine graphite particles, carbon black and an organic binder plural times to form a resin-containing composite sheet comprising uniformly dispersed fine graphite particles and carbon black, burning the resin-containing composite sheet to remove the organic binder, and then pressing it for densification.

Because the heat-dissipating sheet of the present invention is produced by a low-cost process of applying, burning and pressing a relatively inexpensive material comprising fine graphite particles and carbon black, it is advantageously inexpensive, with as high in-plane thermal conductivity as 570 W/mK or more and sufficient mechanical properties for handling. The heat-dissipating sheet of the present invention having such feature is suitable for small electronic appliances such as note-type personal computers, smartphones, mobile phones, etc.

What is claimed is:

1. A method for producing a heat-dissipating sheet, comprising the steps of (1) preparing a dispersion comprising 5-25% by mass in total of fine graphite particles and carbon black, and 0.05-2,5% by mass of an organic binder, in an organic solvent, said fine graphite particles having an average diameter of 3-150 μm and an average thickness of 200 nm to 5 μm and a mass ratio of said fine graphite particles to said carbon black being 75/25 to 95/5; (2) repeating plural times a cycle of applying said dispersion to a surface of a support plate and then drying it, to form a resin-containing composite sheet comprising said fine graphite particles, said carbon black and said organic binder; (3) burning said resin-containing composite sheet to remove said organic binder; and (4) pressing the resultant composite sheet of fine graphite particles and carbon black for densification.

2. The method for producing a heat-dissipating sheet according to claim 1, wherein a mass ratio of said organic binder to the total amount of said fine graphite particles and said carbon black is 0.01-0.5.

3. The method for producing a heat-dissipating sheet according to claim 1, wherein the amount of said dispersion applied by one operation is 5-15 g/m$^2$ (expressed by the total weight of fine graphite particles and carbon black per 1 m$^2$).

4. The method for producing a heat-dissipating sheet according to claim 1, wherein said organic binder is an acrylic resin, a polystyrene resin or polyvinyl alcohol.

5. The method for producing a heat-dissipating sheet according to claim 1, wherein said organic solvent is at least one selected from the group consisting of ketones, aromatic hydrocarbons and alcohols.

6. The method for producing a heat-dissipating sheet according to claim 1, wherein said dispersion is applied by a spraying method.

7. The method for producing a heat-dissipating sheet according to claim 1, wherein said burning step is conducted at a temperature of 550-700° C.

8. The method for producing a heat-dissipating sheet according to claim 1, wherein cooling after burning is gradually conducted to room temperature over 1 hour or more.

9. The method for producing a heat-dissipating sheet according to claim 1, wherein said pressing step is conducted at pressure of 20 MPa or more.

10. The method for producing a heat-dissipating sheet according to claim 1, wherein said resin-containing composite sheet is pressed in a state sandwiched by a pair of planar die plates in a die plate apparatus.

11. The method for producing a heat-dissipating sheet according to claim 10, wherein said die plate apparatus comprises a lower die plate and an upper die plate; and wherein using said lower die plate as said support plate, said resin-containing composite sheet is formed in a cavity of said lower die plate, burned without being peeled from said lower die plate, and then pressed with said lower die plate combined with said upper die plate.

12. The method for producing a heat-dissipating sheet according to claim 1, wherein said composite sheet of fine graphite particles and carbon black is cooled to a temperature equal to or lower than the freezing point of water, and then pressed.

13. The method for producing a heat-dissipating sheet according to claim 1, wherein said pressing step is conducted at a temperature of room temperature to 200° C.

* * * * *